(12) United States Patent
Schulze et al.

(10) Patent No.: US 11,668,751 B2
(45) Date of Patent: Jun. 6, 2023

(54) SENSOR DEVICE AND METHOD FOR DETERMINING AN ALTERNATING VOLTAGE

(71) Applicant: SIEMENS MOBILITY GMBH, Munich (DE)

(72) Inventors: Michael Schulze, Berlin (DE); Olaf Vogt, Berlin (DE)

(73) Assignee: Siemens Mobility GmbH, Munich (DE)

( * ) Notice: Subject to any disclaimer, the term of this patent is extended or adjusted under 35 U.S.C. 154(b) by 35 days.

(21) Appl. No.: 17/256,301

(22) PCT Filed: Jun. 4, 2019

(86) PCT No.: PCT/EP2019/064433
§ 371 (c)(1),
(2) Date: Dec. 28, 2020

(87) PCT Pub. No.: WO2020/001933
PCT Pub. Date: Jan. 2, 2020

(65) Prior Publication Data
US 2021/0263102 A1 Aug. 26, 2021

(30) Foreign Application Priority Data
Jun. 28, 2018 (DE) ................. 10 2018 210 568.5

(51) Int. Cl.
*G01R 31/327* (2006.01)
*G01R 15/16* (2006.01)
*G01R 19/10* (2006.01)

(52) U.S. Cl.
CPC ........... *G01R 31/327* (2013.01); *G01R 15/16* (2013.01); *G01R 19/10* (2013.01)

(58) Field of Classification Search
CPC ........ G01R 15/06; G01R 15/16; G01R 19/10; G01R 31/327
See application file for complete search history.

(56) References Cited

U.S. PATENT DOCUMENTS

| 2001/0003424 A1* | 6/2001 | Kuperman | ............. | G01R 15/06 324/676 |
| 2012/0235666 A1* | 9/2012 | Yanagisawa | ........... | G01R 17/06 324/98 |

(Continued)

FOREIGN PATENT DOCUMENTS

| DE | 1808537 A1 | 6/1970 |
| DE | 102008055651 A1 | 5/2010 |

(Continued)

*Primary Examiner* — Son T Le
*Assistant Examiner* — Adam S Clarke
(74) *Attorney, Agent, or Firm* — Laurence A. Greenberg; Werner H. Sterner; Ralph E. Locher

(57) ABSTRACT

A sensor device determines an alternating voltage between a conductor and a reference potential, particularly of a switch point drive. In order to reduce the installation cost and effort required to verify the absence of reaction, the sensor device has a sensor element, which is configured for capacitive coupling to the conductor, and a resistance element, which is provided for connection to the reference potential and is connected in series together with the sensor element. The sensor device further has a processing device, which is configured to determine a voltage drop via the resistance element.

16 Claims, 3 Drawing Sheets

(56) References Cited

U.S. PATENT DOCUMENTS

2018/0299396 A1\* 10/2018 Freer ................... G08B 21/185
2019/0195919 A1\* 6/2019 Kasai ................... G01R 15/16

FOREIGN PATENT DOCUMENTS

EP 2508898 A1 10/2012
EP 2993480 A1 3/2016

\* cited by examiner

SENSOR DEVICE AND METHOD FOR DETERMINING AN ALTERNATING VOLTAGE

BACKGROUND OF THE INVENTION

Field of the Invention

The invention relates to a sensor device and a method for determining an alternating voltage between a conductor and a reference potential, in particular from a switch drive.

In drive motors, sluggishness may be an indication of an increased probability of damage soon occurring and of the need for maintenance. In switch drives in railway installations, for example, this is utilized in order to undertake diagnostics regarding the status of the switch drive and to schedule maintenance. In switch drives, which are usually operated with alternating current via a four-wire connection, an active power is determined which is representative of the status of the switch drive and varies when sluggishness occurs, for example. The active power is produced, for example, as a product of current and voltage, taking into consideration the phase shift.

A switch diagnostics system is known from DE 10 2008 055651 A1, for example, in which current and voltage are ascertained in the drive cabling of the switch drive, in order to determine the active power therefrom.

For voltage measurement, in accordance with DE 10 2008 055651 A1, a galvanic connection is established with an additional branch from the voltage-carrying conductor to a measurement device, in order to determine the alternating voltage. In this context, operation has to take place with an increased outlay, in order to establish the installation and demonstrate an absence of interaction.

SUMMARY OF THE INVENTION

The object of the present invention is therefore to provide a sensor device and a method of the kind mentioned in the introduction, which are less elaborate compared to known devices and methods with regard to installation and demonstrating the absence of interaction.

According to the invention, the object is achieved by the sensor device mentioned in the introduction, which comprises a sensor element, which is embodied for capacitively coupling to the conductor, a resistor element, which is provided for connecting to the reference potential and is interconnected in series with the sensor device, and a processing device, which is embodied for ascertaining a voltage drop across the resistor element.

The object is furthermore achieved according to the invention by the method mentioned in the introduction, in which a sensor element is capacitively coupled to the conductor, in which a resistor element is interconnected in series with the reference potential and the sensor element and in which a voltage drop across the resistor element is ascertained.

The solution according to the invention has the advantage that no galvanic connection to the conductor and no additional branch at the conductor are needed in order to determine the alternating voltage. Rather, the sensor device according to the invention is galvanically isolated from the conductor and the conductor also has no additional branch, whereby an absence of interaction is present and can be easily demonstrated.

According to the invention, a capacitive-resistive voltage divider is provided, which particularly has positive characteristics at the usual alternating voltages for switch drives of a few hundred volts, e.g. 400 V, as well as line frequencies of 50 Hz or 60 Hz. One of these characteristics is that a level of the voltage drop across the resistor element falls in a range which can be evaluated by measurement in a meaningful manner. Furthermore, a defined, reproducible phase shift between the alternating voltage to be determined and the voltage across the resistor element can be assumed, meaning that this does not have to be determined in an elaborate manner.

The solution according to the invention can be further developed by advantageous embodiments which are described below.

The sensor element may be configured such that it can be arranged coaxially with the conductor. This has the advantage that the sensor device can be arranged on existing conductors, such as the phase conductors of a switch drive for example, very easily as a result. As a result, retrofitting is easily possible in the case of drives already in operation. By way of the coaxial arrangement, a cylinder capacitor is formed from the conductor and the sensor device which is particularly compact and advantageous as a result.

In order to be able to disregard various influencing variables, such as the input impedance of a modern high-impedance processing device or the like for example, when ascertaining the voltage, the resistor element may have a resistance of between 1 and 1000 k$\Omega$. Due to the relatively low resistance of the resistor element, it becomes possible to disregard the other influencing variables and these do not need to be considered when calculating the voltage.

In one advantageous embodiment, the sensor device may have at least one capacitor, which is arranged in parallel with the resistor element. This has the advantage that, due to the capacitor being designed as a concentrated component, a filter against high-frequency interference is integrated in the sensor device. In this context, the capacitor may have a capacitance of at least 1 nF for example.

In order to ensure adequate shielding against electrical external fields or against parasitic influence from adjacent conductors, the sensor device may have at least one shielding element connected to the resistor element. The shielding element is embodied for connecting to the reference potential and is arranged such that the shielding element and the sensor element are capacitively coupled to one another. In this context, the shielding element and the sensor element may be arranged coaxially with one another, at least in sections. A further cylinder capacitor is embodied as a result, which offers advantages due to its compactness.

In a further advantageous embodiment, the sensor element may be embodied such that, in the state in which it is coupled to the conductor, it embodies a capacitor which has a capacitance of at most 500 pF, preferably at most 100 pF. By restricting the capacitance, an approximately constant phase angle can be assumed, meaning that it is not necessary to calibrate the phase angle in the sensor device according to the invention. The advantageous sufficiently small capacitance between sensor element and conductor may, for example, be influenced by the structural embodiment of the sensor device. For example, this may be determined by the insulation between conductor and sensor element which acts as a dielectric medium, or also by the width of the sensor device and in particular of the sensor element.

The processing device may be embodied for calculating the voltage between conductor and reference potential. This has the advantage that no additional processing device is needed to calculate the voltages.

In order to achieve voltage across the resistor element which can be evaluated in a meaningful manner, the sensor device may thus be embodied such that during operation it embodies a capacitor with a capacitance of at least 3 pF with the conductor.

The invention also further relates to a switch diagnostics device with a first sensor device for determining a current in a conductor of a switch drive, with a second sensor device for determining an alternating voltage between the at least one phase conductor and a neutral conductor of the switch drive as a reference potential, and with an evaluation device, which determines a representative active power of the switch drive from the determined current and voltage values. In order to simplify an installation outlay and a demonstration of absence of interaction, provision is made according to the invention for the second sensor device to be embodied according to one of the previously mentioned embodiments.

Moreover, the invention relates to a switch drive with at least one phase conductor for supplying current to the switch drive, with at least one neutral conductor and with at least one sensor device for determining an alternating voltage between the at least one phase conductor and the neutral conductor as reference potential. In order to reduce an installation outlay and the ability to demonstrate an absence of interaction, provision is made according to the invention for the sensor device to be embodied according to one of the previously mentioned embodiments.

Finally, the invention also relates to a method for switch diagnostics, in which an alternating voltage between a phase conductor and a neutral conductor of a switch drive as reference potential and an alternating current in the phase conductor are determined and in which an active power of the switch drive is determined by means of the alternating voltage and the alternating current and in which a status of the switch drive is diagnosed on the basis of the active power. In order to simplify an installation outlay and the ability to demonstrate an absence of interaction, provision is made according to the invention for the alternating voltage to be determined according to the previously mentioned method according to the invention.

The invention will be described below making reference to the accompanying drawings.

DETAILED DESCRIPTION OF THE INVENTION

Figure 1:
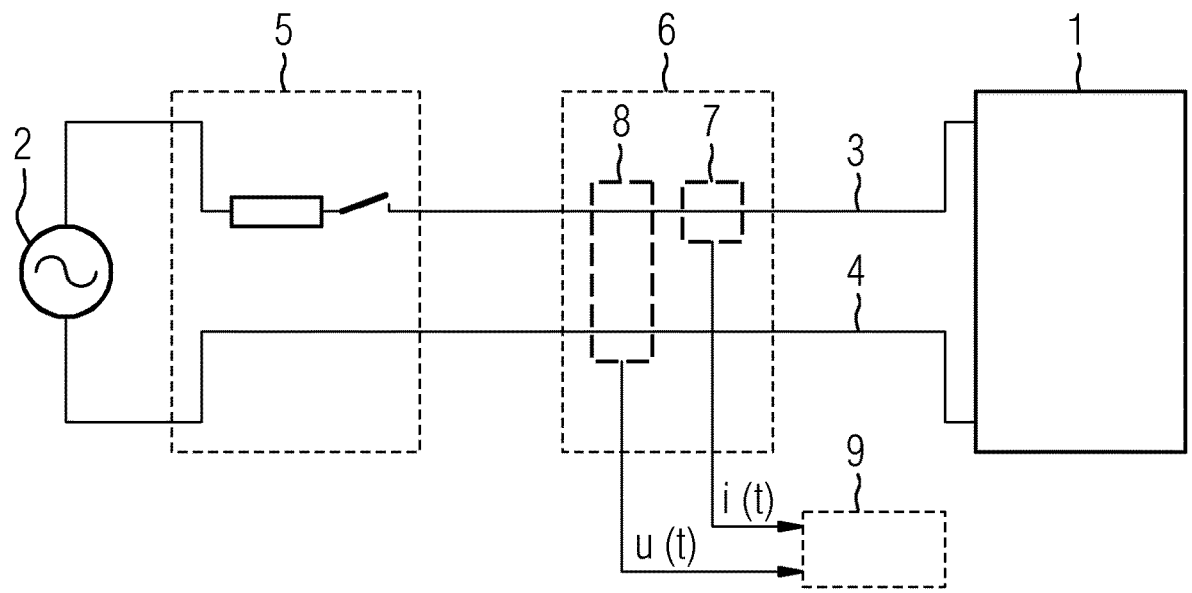
FIG. 1 shows a schematic representation of a switch drive according to the invention with a sensor device according to the invention.

FIG. 1 shows a switch drive 1 according to the invention, which is connected to an alternating voltage source 2.

In this context, a phase conductor 3 is connected to a phase of the alternating voltage source 2 and a neutral conductor 4 to a neutral conductor of the alternating voltage source 2.

If necessary, a disconnector circuit 5 may be arranged between alternating voltage source 2 and switch drive 1, which if necessary may have a variable series resistor.

Furthermore, a switch diagnostics device 6 is arranged between alternating voltage source 2 and switch drive 1. The switch diagnostics device 6 comprises a first sensor device 7 for determining a current in the phase conductor 3 and a second sensor device 8 for determining an alternating voltage between the phase conductor 3 and the neutral conductor 4. The switch diagnostics device 6 additionally has an evaluation device 9, which is able to determine a representative active power of the switch drive 1 from the ascertained current and voltage values. The active power is representative of the status of the switch drive 1 and is used for the diagnostics.

Figure 2:
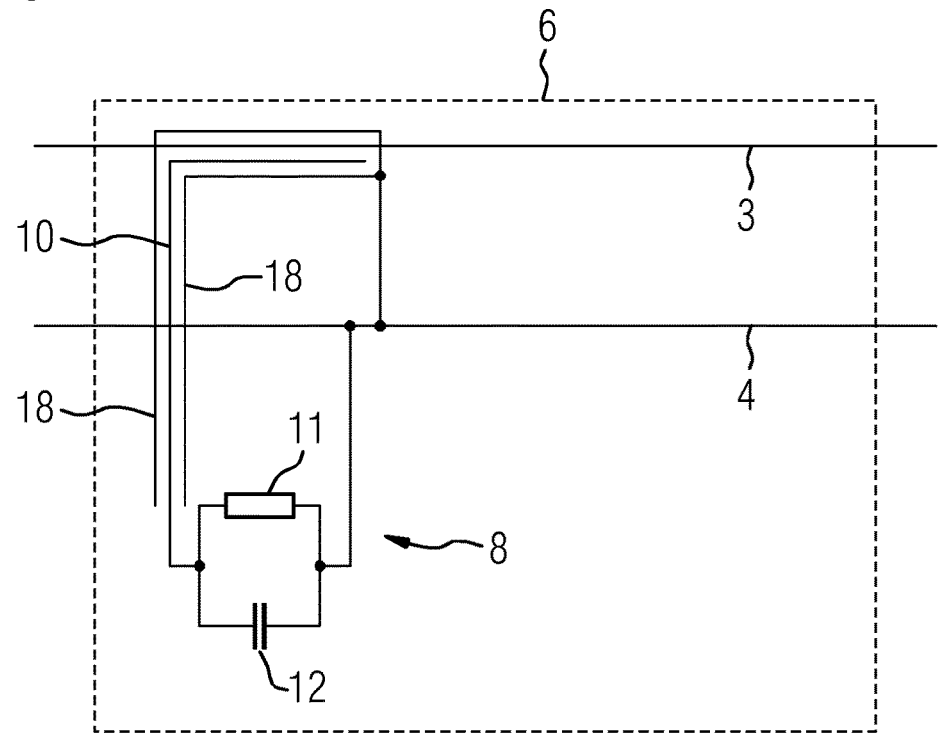
FIG. 2 shows a schematic representation of the exemplary embodiment of a sensor device according to the invention from FIG. 1.

FIG. 2 shows the switch diagnostics device 6 from FIG. 1 in detail, wherein for the sake of simplicity merely the second sensor device 8 according to the invention is shown.

Figure 5:
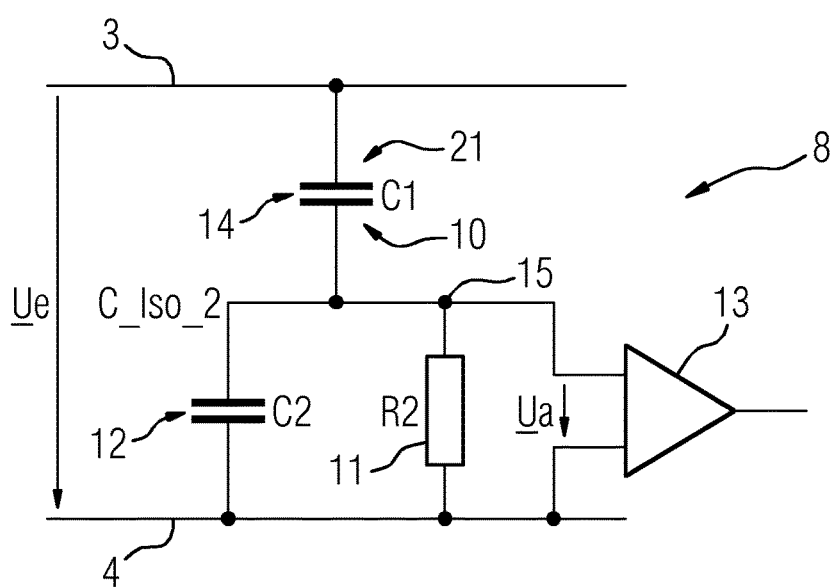
FIG. 5 shows a schematic representation of a circuit diagram of the sensor device according to the invention according to FIGS. 2-4.

First, the structure of the sensor device 8 according to the invention is described on the basis of the schematic equivalent circuit diagram in FIG. 5.

The sensor device 8 is coupled to the phase conductor 3 and the neutral conductor 4 of the switch drive 2 (not shown in FIG. 5). In the exemplary embodiment in FIG. 5, the sensor device comprises a sensor element 10, a resistor element 11, a capacitor 12 and a processing device 13.

The sensor element 10 is electrically conductive and embodied for capacitively coupling to the phase conductor 3. Together with the phase conductor 3, the sensor element 10 forms a capacitor 14 during operation of the sensor device 8.

For example, the resistor element 11 is embodied as an ohmic resistor and is galvanically connected to the neutral conductor 4 as reference potential during operation of the sensor device 8. The resistor element 11 is interconnected in series with the sensor element 10 and, in the exemplary embodiment in the figures, has a resistance of 100 kΩ for example. Here, another resistance naturally also may be used, preferably between 1 and 1000 kiloohms.

The capacitor 12 is interconnected in parallel with the resistor element 11 and, in the exemplary embodiment in the figures, has a capacitance of 1 nF.

The processing device 13 is embodied for ascertaining a voltage drop $\underline{U}a$ across the resistance element 11. This voltage $\underline{U}a$, as shown in FIG. 5 for example, is coupled out between the neutral conductor 4 and a node point 15 between the resistance element 11 and the sensor element 10.

As shown in FIG. 5, the sensor device according to the invention embodies a capacitive-resistive voltage divider between the phase conductor 3 and the neutral conductor 4.

Figure 3:
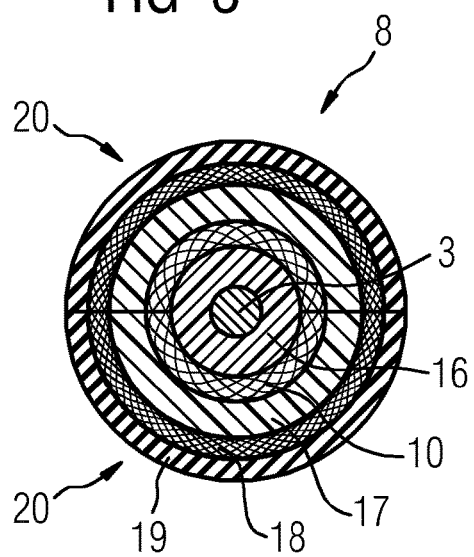
FIGS. 3 and 4 show various views of schematic representations of the exemplary embodiment of the sensor device according to the invention from FIG. 2.
Figure 4:
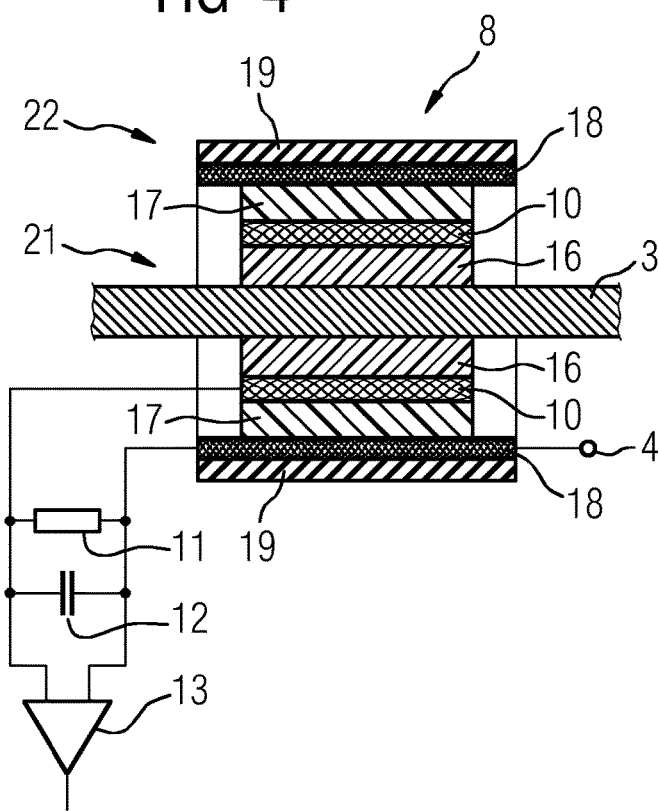

In the following, the advantageous embodiment according to the invention of the sensor device 8 according to the invention is described with reference to FIGS. 3 and 4. The arrangement is shown in a cross-section in FIG. 3, and in a longitudinal section in FIG. 4.

In this context, the sensor device 8 is arranged coaxially with the phase conductor 3, at least in sections. The phase conductor 3 and the surrounding insulation 16 thereof are arranged within the sensor device 8 for ascertaining the voltage. In this context, the sensor element 10 is arranged coaxially around the phase conductor 3 and the insulation 16 thereof. The sensor element 10 and the phase conductor 3 together form a cylinder capacitor, in which the insulation 16 acts as a dielectric medium. The sensor element 10 is surrounded in turn by a further insulation 17 on the outside. Arranged around this insulation 17 in turn is a conductive shielding element 18, which is likewise embodied coaxially with the phase conductor 3 and as a result embodies a further cylinder capacitor with the sensor element 10. The sensor device 8 is provided with an outer insulation 19 around the shielding element 18 on the outside. Alternatively, a sensor device without a shielding element 18 would also be conceivable.

For the purpose of simpler handling, the sensor device 8 according to the invention may be embodied in a split manner and, for example, may have two halves 20 as a result. Due to this ability to be split, the sensor device 8 can be arranged around the phase conductor 3 in a particularly simple manner. The shielding element 18 is connected to the neutral conductor 4 as reference potential. As already described with reference to FIG. 5, the resistor element 11 is interconnected between the sensor element 10 and the shielding element 18, with the capacitor 12 interconnected in parallel therewith. The processing device 13 in turn ascertains the voltage drop across the resistor element 11.

As shown in FIG. 2, the shielding element 18 is guided up to the branch of the resistor element 11 and capacitor 12, in order to ensure effective shielding. Although the processing device 13 is not shown in FIG. 2, it is present nevertheless and belongs to the embodiment shown.

Figure 6:
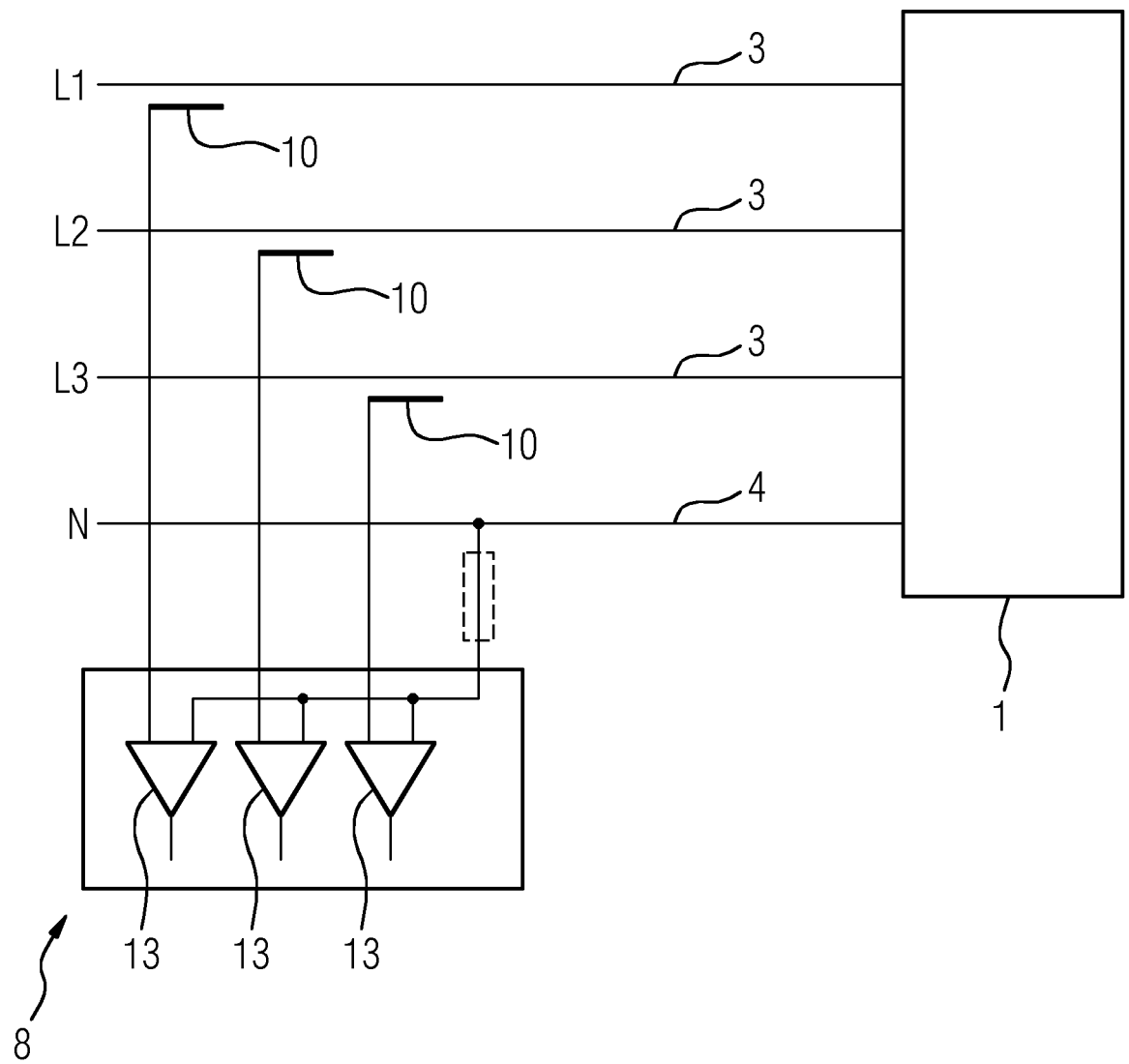
FIG. 6 shows a principal schematic representation of a further embodiment of a sensor device according to the invention.

FIG. 6 shows an alternative embodiment of the sensor device according to the invention, which compared to the previously described embodiment measures the alternating voltage in three phase conductors 3. For this purpose, the sensor device 8 in FIG. 6 is embodied with three sensor elements 10, which are capacitively coupled to one of the phase conductors 3 in each case. The ascertaining of the alternating voltage in each phase conductor 3, however, corresponds to that in the previously described embodiment of FIGS. 1 to 5.

In general, and independently of the embodiments, the sensor device 8 according to the invention has the advantage that the phase conductor 3 and the insulation 16 thereof can be used in their form already present, without themselves having to be modified or contacted. As a result, the sensor device 8 according to the invention is also particularly suitable for retrofitting in existing switch drives 1. In the sensor device 8 according to the invention, once it is arranged on the phase conductor 3, the first cylinder capacitor 21 is produced with a capacitance C1 from the sensor element 10 and the phase conductor 3, with a second cylinder capacitor 22 C_iso_2 also being produced between the sensor element 10 and the shielding element 18.

In the sensor device 8 according to the invention, a capacitive-resistive voltage divider is embodied which has the following characteristics due to the dimensioning according to the invention and the operation at alternating voltages of a few hundred volts, as is usual in switch drives 1, as well as at a line frequency of 50 Hz or 60 Hz for example:

The level of the tapped voltage $\underline{U}a$ lies in a range which can be evaluated by measurement in a meaningful manner.

There is a defined, reproducible phase shift between the voltage $\underline{U}e$ to be measured and the voltage $\underline{U}a$ at the resistor element 11.

Adequate shielding against electrical external fields or also against parasitic influence from adjacent conductors takes place by way of the shielding element 18.

In this case, it is advantageous if the following limiting conditions are observed:

The capacitor 14 is embodied such that it has a capacitance of >3 pF. This makes it possible to reach a voltage $\underline{U}a$ which can be evaluated by simple means. It can be assumed that conductor resistances and conductor inductances are low enough to be disregarded with the frequencies below 1 kHz being considered and the size of the sensor element 10. The sensor element 10 may be approx. 40 mm wide, for example. It can furthermore be assumed that insulation resistances of the insulations 16 and 17 acting as dielectric media are high in such a way that they do not have to be taken into consideration in the impedance calculation. Another further protective insulation (not shown) may also be used around the insulation 16, if necessary.

In the exemplary embodiment of FIGS. 1 to 5, the capacitance C2 of the additional capacitor 12 of 1 nF and the resistance of the resistor element 11 of 100 kΩ are chosen such that both the capacitance C_iso_2 and the input impedance of the processing device 13 can be disregarded as a result. As already mentioned above, the additional capacitor 12 furthermore acts as a filter against high-frequency interference.

For a magnitude to be assumed for the capacitance of C1 of a few pF, attenuation factors in the magnitude of approx. 1:5000 and phase angles between the voltage $\underline{U}e$ to be measured and the measured voltage $\underline{U}a$ around −90° are produced for operating frequencies of 50 Hz or 60 Hz. Since the resistance of the resistor element 11 and the capacitance of the capacitor 12 are known, the attenuation factor substantially depends upon the capacitance C1 and could be determined by calibration. However, since the phase angle can be anticipated to be constantly between −87° and −89° with the known frequencies and a sufficiently low capacitance C1 of significantly <500 pF, it is possible to dispense with the calibration thereof. This is advantageous.

The invention claimed is:

1. A sensor device for determining an alternating voltage between a conductor and a reference potential, the sensor device comprising:
   a sensor element embodied for capacitively coupling to the conductor;
   a resistor for connecting to the reference potential and being interconnected in series with said sensor element;
   a processor for ascertaining a voltage drop across said resistor; and
   at least one shielding element connected to said resistor, said resistor embodied for connecting to the reference potential, said at least one shielding element disposed such that said at least one shielding element and said sensor element are capacitively coupled to one another, and said at least one shielding element located at a distance that is radially further away from the conductor than a distance at which said sensor element is located.

2. The sensor device according to claim 1, wherein said sensor element is disposed coaxially with the conductor.

3. The sensor device according to claim 2, further comprising at least one capacitor disposed in parallel with said resistor.

4. The sensor device according to claim 3, wherein said at least one capacitor has a capacitance of at least 1 nF.

5. The sensor device according to claim 1, wherein said resistor has a resistance between 1 and 1000 kiloohms.

6. The sensor device according to claim 1, wherein said at least one shielding element is disposed around said sensor element.

7. The sensor device according to claim 1, wherein said at least one shielding element and said sensor element are disposed coaxially with one another, at least in sections.

8. The sensor device according to claim 1, wherein said sensor element is embodied such that, in a state in which said sensor element is coupled to the conductor, said sensor element embodies a capacitor which has a capacitance of at most 500 pF.

9. The sensor device according to claim 8, wherein the capacitance of said capacitor is at most 100 pF.

10. The sensor device according to claim 1, wherein said processor is embodied for calculating a voltage between the conductor and the reference potential.

11. The sensor device according to claim 1, wherein the sensor device is embodied such that during operation it embodies a capacitor with a capacitance of at least 3 pF with the conductor.

12. The sensor device according to claim 1, wherein the sensor device determines the alternating voltage between the conductor and the reference potential of a switch drive.

13. A switch diagnostics device, comprising:
a first sensor device for determining a current in at least one phase conductor of a switch drive;
a second sensor device for determining an alternating voltage between the at least one phase conductor and a neutral conductor of the switch drive, said second sensor device including:
a sensor element embodied for capacitively coupling to the at least one phase conductor,
a resistor for connecting to the neutral conductor and being interconnected in series with said sensor element,
a processor for ascertaining a voltage drop across said resistor, and
at least one shielding element connected to said resistor, said resistor embodied for connecting to the reference potential, said at least one shielding element disposed such that said at least one shielding element and said sensor element are capacitively coupled to one another, and said at least one shielding element located at a distance that is radially further away from the conductor than a distance at which said sensor element is located; and
an evaluation device for determining a representative active power of the switch drive from the current and the alternating voltage determined.

14. A switch drive, comprising:
at least one phase conductor for supplying current;
at least one neutral conductor; and
at least one sensor device for determining an alternating voltage between said at least one phase conductor and said at least one neutral conductor, said at least one sensor device including:
a sensor element embodied for capacitively coupling to said at least one phase conductor;
a resistor for connecting to said at least one neutral conductor and being interconnected in series with said sensor element;
a processor for ascertaining a voltage drop across said resistor; and
at least one shielding element connected to said resistor, said resistor embodied for connecting to the reference potential, said at least one shielding element disposed such that said at least one shielding element and said sensor element are capacitively coupled to one another;
said at least one shielding element located at a distance that is radially further away from said at least one phase conductor than a distance at which said sensor element is located.

15. A method for determining an alternating voltage between a conductor and a reference potential, which comprises the steps of:
capacitively coupling a sensor element to the conductor;
interconnecting a resistor of the sensor element in series with the reference potential;
connecting at least one shielding element to the resistor, the resistor embodied for connecting to the reference potential, the at least one shielding element disposed such that the at least one shielding element and the sensor element are capacitively coupled to one another, and the at least one shielding element located at a distance that is radially further away from the conductor than a distance at which said sensor element is located; and
ascertaining a voltage drop across the resistor in the sensor element.

16. A method for switch diagnostics, which comprises the steps of:
determining an alternating voltage between a phase conductor and a neutral conductor of a switch drive and an alternating current in the phase conductor, the alternating voltage being determined by the substeps of:
capacitively coupling a sensor element to the phase conductor,
interconnecting a resistor of the sensor element in series with the neutral conductor,
connecting at least one shielding element to the resistor, the resistor embodied for connecting to the reference potential, the at least one shielding element disposed such that the at least one shielding element and the sensor element are capacitively coupled to one another, and the at least one shielding element located at a distance that is radially further away from the phase conductor than a distance at which said sensor element is located, and
ascertaining the alternating voltage dropping across the resistor in the sensor element;
determining an active power of the switch drive by means of the alternating voltage and the alternating current; and
diagnosing a status of the switch drive on a basis of the active power.

* * * * *